United States Patent [19]
Klein et al.

[11] Patent Number: 5,122,915
[45] Date of Patent: Jun. 16, 1992

[54] LOW-NOISE PREAMPLIFIER FOR MAGNETO-RESISTIVE HEADS

[75] Inventors: Hans W. Klein; Corey D. Petersen, both of Pleasanton, Calif.

[73] Assignee: Minnesota Mining and Manufacturing Company, St. Paul, Minn.

[21] Appl. No.: 588,637

[22] Filed: Sep. 26, 1990

[51] Int. Cl.$^5$ ............... G11B 5/127; G11B 5/02
[52] U.S. Cl. .......................... 360/113; 360/67
[58] Field of Search ................ 360/113, 67, 68, 46

[56] References Cited

U.S. PATENT DOCUMENTS 4,833,559  5/1989  Belk ........................ 360/113
4,879,610  11/1989  Jove et al. ................ 360/113

Primary Examiner—Vincent P. Canney
Attorney, Agent, or Firm—Gary L. Griswold; Walter N. Kirn; William B. Barte

[57] ABSTRACT

A preamplifer for use with a magneto-resistive playback head in which a d.c. current source provides current through a field effect transistor and the magneto-resistive element to ground. An operational transconductance amplifier included in a feedback loop provides a bias voltage for the field-effect transistor, whereby the voltage across the said magneto-resistive element is held constant while the resistance of said element changes. The resulting a.c. current flowing through the magneto-resistive element flows only through the feedback loop and an output resistor connected across the inputs of the operational transconductance amplifier. The amplification of the circuit is approximately the resistance of the output resistor divided by the resistance of the magneto-resistive element.

5 Claims, 1 Drawing Sheet

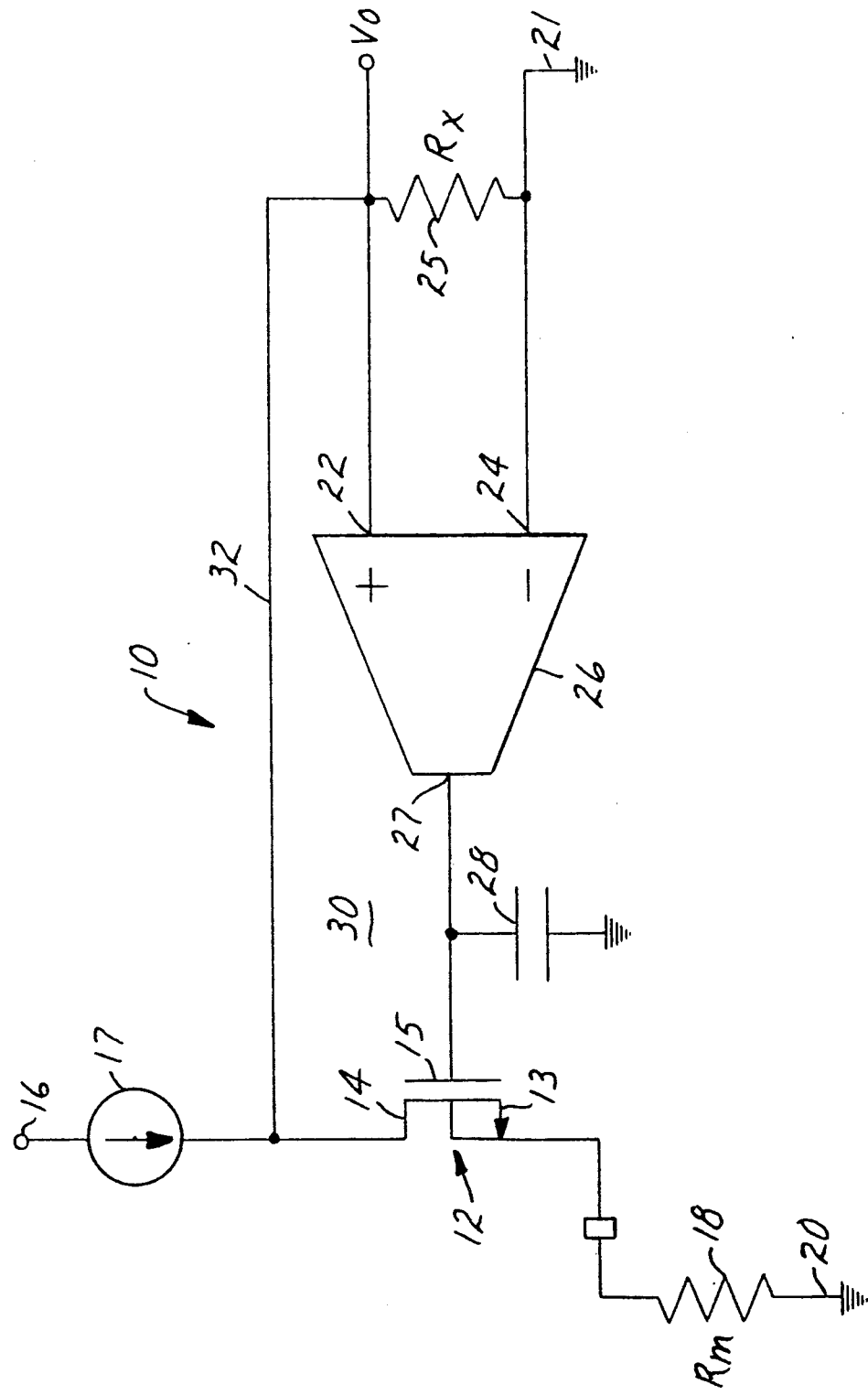

LOW-NOISE PREAMPLIFIER FOR MAGNETO-RESISTIVE HEADS

BACKGROUND OF THE INVENTION

This invention relates generally to electrical signal preamplifiers, and more particularly the invention relates to a preamplifier for magneto-resistive heads as used in reading data from magnetic tapes.

Recent developments in high density read-channel head technology have resulted in magneto-resistive (MR) heads which need bias currents up to 20 mA while delivering up to 20 mV of signal amplitude. Even so, very low noise levels are still necessary to pick up much smaller signals while also being capable of handling relatively large signal swings at high frequencies. Miniaturization of tape and disk storage technology requires the integration of more than one preamplifier along with biasing capabilities for both read and bias MR heads.

SUMMARY OF THE INVENTION

This invention is directed to a fully integrated preamplifier which is dedicated to MR heads implementable in a 1.2 um CMOS technology. A new input architecture has been developed that addresses both high-current biasing and low noise requirements. The preamplifier input is single-ended, which makes it possible to use less expensive and smaller single-ended MR heads.

The preamplifier performs biasing of a resistive single-ended magneto-resistive sensor, conversion of changes in the sensor resistance into current or voltage signals, and wide-band amplification. In a preferred embodiment, the preamplifier is integrated with a current source which provides a large operating current to the input transistor and also biases the external resistive sensor. With the present preamplifier, a low noise level and a large bandwidth are achieved at the same time that large operating currents required to drive MR sensors are present. Since no external bias current source is necessary, the noise performance of this circuit is superior over other approaches.

The invention and objects and features thereof will be more readily apparent from the following detailed description and appended claims when taken with the drawing.

BRIEF DESCRIPTION OF THE DRAWING

The FIGURE is a schematic of a preamplifier in accordance with one embodiment of the invention.

DETAILED DESCRIPTION OF ILLUSTRATIVE EMBODIMENTS

Referring now to the drawing, the preamplifier (10) includes an input CMOS transistor (12) having a source (13), drain 14, and base 15, and which is serially connected with a d.c. bias voltage, $V_{DD}$ applied at terminal (16). The voltage $V_{DD}$ is coupled to a d.c. current source (17) which provides a current I which flows through a magneto-resistive sensor head (not shown) but which has an effective resistance $R_m$ (18) to ground (20). As connected, the d.c. current remains constant, while the resistance $R_x$ (18) of the sensor head changes while reading data from a tape, thereby generating an a.c. voltage across and an a.c. current through $R_m$ (18). The a.c. current component is applied to an output resistor, $R_x$ (25), which is connected to a reference voltage (21). The a.c. voltage developed across $R_x$ (25) is the amplified output voltage, $V_{OUT}$, and is also applied to the inputs (22 and 24) of an operational transconductance amplifier (26). The output of the operational preamplifier develops a charge on a capacitor (28) which biases the gate of the input transistor (12).

The input transistor (12) is operated in a "common-gate" configuration, in which the voltage on the gate (15) is provided by a feedback loop (30) consisting of the operational transconductance amplifier (26) and capacitor (28). This feedback loop makes sure that the bias current $I_o$ is fully directed through the input transistor (12) and, hence through the MR sensor. Since the sensor, as represented by its effective resistance $R_M$ (18) is connected to a low-impedance node (the source (13) of transistor (12)), the voltage across $R_M$ is held constant. This, in turn, results in an AC current through the transistor (12) when the resistance of $R_M$ changes. The AC current can only flow via lead (32) through $R_x$ (25) to "$A_{GND}$" (21) (or any other low impedance node) or reference voltage. As the AC current flows through $R_x$ (25), an AC voltage is created, the amplitude of which can be made larger than the original signal across $R_x$ (25). Hence, amplification is performed.

In order to let a signal appear across $R_x$, the feedback loop (30) must not be active at the frequencies of interest. The gain band-width (GBW) of that loop is determined by the gm of the operational amplifier (26), the capacitor (28), the parasitic capacitors associated with the input transistor (12), and the Gate-to-Drain gain of that transistor. Especially, the gm of the operational amplifier (26) and capacitor (28) are independent variables which can be designed such that the loop gain rolls off at low enough frequencies. In that case, the gain from the input to the output of this preamplifier is approximately:

$$\text{Gain} = R_x/(R_M + 1/gm_I)$$

where $gm_I$ represents the transconductance of the input transistor (12).

Since $gm_I$ is typically a fairly large value, this self-contained circuit provides biasing, conversion, and amplification for wide-band signals. This is very beneficial for applications such as integrated preamplifiers for tape or disk storage technology.

In one embodiment, the gain of the input stage has been set to 20 dB. The key noise contributors are the current source (17) and the input transistor (12). The devices involved are, therefore, quite large. Width to length ratio of the input transistor (12) is 10000/1.5. However, in having just one input device instead of two (as for differential input pairs) and forcing the MR bias current as operating current through the input transistor, both the size of the input stage and the current consumption are drastically reduced.

In order to provide for a differential group delay of less than 2.5 ns over 0.5–5 MHz, the GBW product for operational amplifier 26 in conjunction with the capacitor (28) is less than 150 Hz. This small $g_M/C$ ratio is accomplished by a large on-chip capacitor (100 pF) and an OTA (26) which utilizes a $g_M$-reduction scheme. As a result, the dominant pole of this configuration is far below 1 Hz. The high frequency poles are located at some 30 MHz while the load capacitors (50 pF) place the load poles at 25 MHz.

There has been described an improved low noise preamplifier for a magneto-resistive head. While the invention has been described with reference to one embodiment, the description is illustrative of the invention and is not to be construed as limiting the invention. Various modifications and applications may occur to those skilled in the art without departing from the true spirit and scope of the invention as defined by the appended claims.

We claim:

1. A preamplifier for a magneto-resistive sensor having an effective resistance, said preamplifier comprising
   an input transistor having input, output and control elements, the input and output elements being connected in series with said sensor element,
   means coupled to said sensor for providing an output signal indicative of varying magnetic fields at said sensor, and
   a feedback loop for providing a control signal on the control element of said transistor, such that a predetermined fraction of a constant current supplied to said preamplifier flows through said transistor and sensor, thereby providing a fixed bias in said sensor and a different predetermined fraction of said constant current flows through said output signal providing means, said feedback loop including means responsive to an error current in said output signal production means when current other than said different fraction of said predetermined current flows therethrough, for providing a said control signal which changes the operating conditions of said transistor in such a manner as to substantially eliminate said error current and maintain said predetermined fractional currents, and means for blocking dynamic changes in said control signal such that the control element of the transistor responds only to static conditions, and an AC output voltage developed at said feedback providing means is proportional to varying magnetic fields present at said sensor.

2. A preamplifier according to claim 1, wherein said input transistor comprises a MOS having source drain and gate elements.

3. A preamplifier according to claim 1, wherein said control signal providing means comprises an operational transconductive amplifier.

4. A preamplifier according to claim 3, wherein said dynamic charge blocking means comprises a capacitor coupled to said transconductance amplifier such that the loop gain rolls off at low frequencies.

5. A preamplifier according to claim 1, comprising an input field effect transistor having a source, drain, and gate, the source and drain being connected in series with the effective resistance of said sensor,
   means for serially connecting a d.c. current source through said source and drain of said transistor, and through said effective resistance of said magneto-resistive element to a circuit ground, and
   a said feed-back loop for providing a bias voltage on said gate of said amplifier, including an operational transconductance amplifier having two input terminals and an output terminal, means connecting said output resistor across said two input terminals, capacitive means connected between said output terminal and a circuit ground, and means connecting said output terminal to said gate element of said transistor,
   whereby d.c. bias current from a said d.c. current source is fully directed through said input transistor and said magneto-resistive element to ground and voltage across said magneto-resistive element is held constant, and wherein a.c. current flow through said input transistor resulting from changes in resistance of said magneto-resistance element flows only through said feedback loop and said output resistor to ground.

* * * * *

UNITED STATES PATENT AND TRADEMARK OFFICE
CERTIFICATE OF CORRECTION

PATENT NO. : 5,122,915
DATED : June 16, 1992
INVENTOR(S) : Hans W. Klein and Corey D. Petersen It is certified that error appears in the above-identified patent and that said Letters Patent is hereby corrected as shown below:

Column 4, line 22, "amplifier" should read --transistor--.

Signed and Sealed this

Thirty-first Day of August, 1993

Attest:

BRUCE LEHMAN

Attesting Officer    Commissioner of Patents and Trademarks